US010520838B2

(12) United States Patent
Schaffer et al.

(10) Patent No.: US 10,520,838 B2
(45) Date of Patent: Dec. 31, 2019

(54) MOUNTING ARRANGEMENT FOR AN OPTICAL IMAGING ARRANGEMENT

(71) Applicant: Carl Zeiss SMT GmbH, Oberkochen (DE)

(72) Inventors: Dirk Schaffer, Jena (DE); Jens Prochnau, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/191,627

(22) Filed: Nov. 15, 2018

(65) Prior Publication Data
US 2019/0086823 A1    Mar. 21, 2019

Related U.S. Application Data

(63) Continuation of application No. PCT/EP2016/060970, filed on May 17, 2016.

(51) Int. Cl.
*G03F 7/20*     (2006.01)
*G02B 7/182*   (2006.01)
*G02B 7/18*     (2006.01)

(52) U.S. Cl.
CPC ......... *G03F 7/70891* (2013.01); *G02B 7/181* (2013.01); *G02B 7/182* (2013.01); *G03F 7/70825* (2013.01)

(58) Field of Classification Search
CPC .... G02B 27/021; G02B 7/027; G03F 7/70891

USPC ..................................... 355/53, 67
See application file for complete search history.

(56) References Cited

U.S. PATENT DOCUMENTS

| 2004/0214483 | A1* | 10/2004 | Mizuno | G02B 7/027 |
| | | | | 439/894 |
| 2007/0146906 | A1* | 6/2007 | Kugler | G02B 7/008 |
| | | | | 359/819 |
| 2008/0204689 | A1* | 8/2008 | Heintel | G02B 7/021 |
| | | | | 355/67 |
| 2012/0182533 | A1 | 7/2012 | Schoeppach et al. | |

FOREIGN PATENT DOCUMENTS

DE    10 2007 044 054    4/2008

OTHER PUBLICATIONS

International Search Report and Written Opinion for corresponding PCT Appl No. PCT/EP2016/060970, dated Feb. 1, 2017.

\* cited by examiner

*Primary Examiner* — Hung Nguyen
(74) *Attorney, Agent, or Firm* — Fish & Richardson P.C.

(57) ABSTRACT

A connection arrangement for connecting an optical component of an optical imaging arrangement to a support unit of a support structure includes: a connecting element unit having a support interface end with support interface section; and a component interface end with a component interface section.

20 Claims, 3 Drawing Sheets

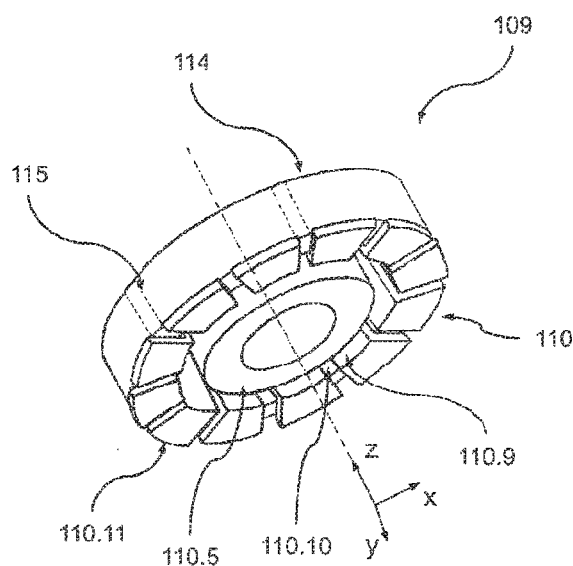
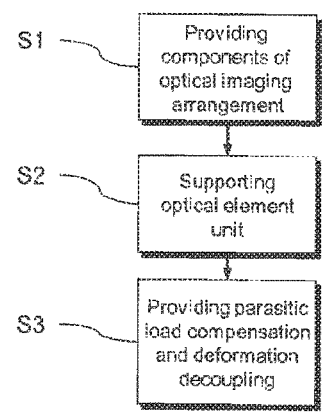
Fig. 3
Fig. 4
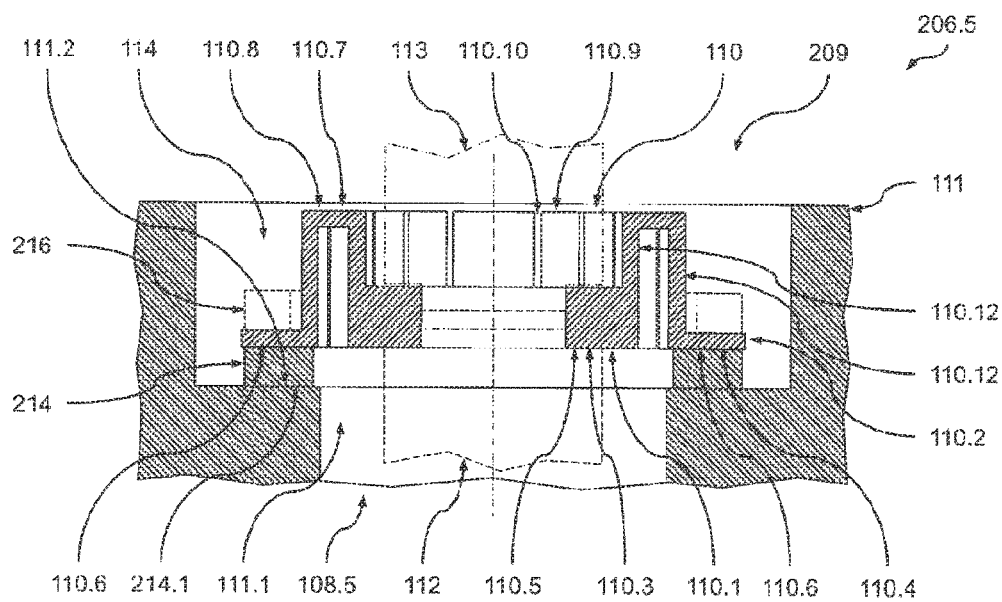
Fig. 5

MOUNTING ARRANGEMENT FOR AN OPTICAL IMAGING ARRANGEMENT

CROSS-REFERENCE TO RELATED APPLICATIONS

The present application is a continuation of, and claims benefit under 35 USC 120 to, international application PCT/EP2016/060970, filed May 17, 2016. The entire disclosure of this application is incorporated by reference herein.

FIELD

The disclosure relates to connection arrangements for components of the optical imaging arrangements used in exposure processes, in particular in exposure processes performed by microlithography systems. It further relates to methods of connecting components of an optical imaging arrangement as well as to optical imaging methods. The disclosure may be used in the context of photolithography processes for fabricating microelectronic devices, in particular semiconductor devices, or in the context of fabricating devices, such as masks or reticles, used during such photolithography processes.

BACKGROUND

Typically, the optical systems used in the context of fabricating microelectronic devices such as semiconductor devices include a plurality of optical element units including optical elements, such as lenses and mirrors etc., arranged in the exposure light path of the optical system. Those optical elements usually cooperate in an exposure process to transfer an image of a pattern formed on a mask, reticle or the like onto a substrate such as a wafer. The optical elements are usually combined in one or more functionally distinct optical element groups. These distinct optical element groups may be held by distinct optical exposure units. In particular with mainly refractive systems working at a wavelength in the so-called vacuum ultraviolet (VUV) range (e.g. at a wavelength of 193 nm), such optical exposure units are often built from a stack of optical element modules holding one or more optical elements. These optical element modules usually include an external generally ring shaped support device supporting one or more optical element holders each, in turn, holding an optical element.

Due to the ongoing miniaturization of semiconductor devices there is, however, it is desirable to enhance resolution of the optical systems used for fabricating those semiconductor devices. This pushes the desire for an increased numerical aperture (NA) and increased imaging accuracy of the optical system.

One approach to achieve enhanced resolution is to reduce the wavelength of the light used in the exposure process. In the recent years, approaches have been taken using light in the extreme ultraviolet (EUV) range, typically using wavelengths ranging from 5 nm to 20 nm, in most cases about 13 nm. In this EUV range it is not possible to use common refractive optics any more. This is due to the fact that, in this EUV range, the materials commonly used for refractive optical elements show a degree of absorption that is too high for obtaining high quality exposure results. Thus, in the EUV range, reflective systems including reflective elements such as mirrors or the like are used in the exposure process to transfer the image of the pattern formed on the mask onto the substrate, e.g. the wafer.

The transition to the use of high numerical aperture (e.g. NA>0.4 to 0.5) reflective systems in the EUV range leads to considerable challenges with respect to the design of the optical imaging arrangement.

One of the desired accuracy properties is the accuracy of the position of the image on the substrate, which is also referred to as the line of sight (LoS) accuracy. The line of sight accuracy typically scales to approximately the inverse of the numerical aperture. Hence, the line of sight accuracy is a factor of 1.4 smaller for an optical imaging arrangement with a numerical aperture NA=0.45 than that of an optical imaging arrangement with a numerical aperture of NA=0.33. Typically, the line of sight accuracy ranges below 0.5 nm for a numerical aperture of NA=0.45. If double patterning is also to be allowed for in the exposure process, then the accuracy would typically have to be reduced by a further factor of 1.4. Hence, in this case, the line of sight accuracy would range even below 0.3 nm.

Among others, the above leads to very strict desired properties with respect to the relative position between the components participating in the exposure process as well as the deformation of the individual components. Furthermore, to reliably obtain high-quality semiconductor devices it is not only desirable to provide an optical system showing a high degree of imaging accuracy. It is also desirable to maintain such a high degree of accuracy throughout the entire exposure process and over the lifetime of the system. As a consequence, the optical imaging arrangement components, i.e. the mask, the optical elements and the wafer, for example, cooperating in the exposure process is supported in a well-defined manner in order to maintain a predetermined spatial relationship between the optical imaging arrangement components and to provide minimum undesired deformation as well to provide a high quality exposure process.

To maintain the predetermined spatial relationship between the optical imaging arrangement components throughout the entire exposure process, even under the influence of vibrations introduced, among others, via the ground structure supporting the arrangement and/or via internal sources of vibration disturbances, such as accelerated masses (e.g. moving components, turbulent fluid streams, etc.), as well as under the influence of thermally induced position alterations, in imaging arrangements working either the EUV range or the VUV range, it is desirable to at least intermittently capture the spatial relationship between certain components of the optical imaging arrangement and to adjust the position of at least one of the components of the optical imaging arrangement as a function of the result of this capturing process. Similar applies to the deformation of at least some of these components of the optical imaging arrangement.

These active solutions, however, typically involve active systems including a large number of actuators and sensors etc. Heat dissipation of these components increasingly aggravates thermal issues arising in such imaging arrangements, especially if they are located inside the housing receiving the optical elements, e.g. inside the so-called lens barrel.

One particular issue that arises with heat dissipation is the fact that optical elements used in such optical imaging processes, typically, are made of comparatively expensive materials having a very low coefficient of thermal expansion in order to avoid distortion of the optical surfaces due to thermally induced deformation of the optical element. On the other hand, not least for cost reasons, the support structure of such optical element units is made of less expensive materials, typically having a noticeably higher coefficient of thermal expansion than the material of the optical element.

As a consequence, typically, some sort of parasitic deformation decoupling is provided (in at least one decoupling degree of freedom, typically several decoupling degrees of freedom) between the support structure and the optical element in order to at least partially compensate for such differences in thermal expansion between the support structure and the optical element. Such parasitic deformation decoupling, typically, is achieved via parts located in the force flow between the support structure and the optical element, which are sufficiently compliant in the decoupling degree(s) of freedom in order to absorb the differences in thermal expansion.

An issue that, among others, arises in this context is the fact that many materials allowing achievement of such deformation decoupling properties (i.e., among others, sufficient compliance to provide such deformation decoupling in certain degrees of freedom) have a coefficient of thermal expansion, which has a considerable mismatch with the coefficient of thermal expansion of the optical element (as is the case with most metal materials). Hence, despite their compliance, use of such materials leads to the generation of noticeable parasitic stresses at the interface with the optical element.

On the other hand, other materials with a matching coefficient of thermal expansion, in many cases, do not provide sufficient compliance to provide such parasitic deformation decoupling (as is the case, for example, with most ceramic materials). Hence, even a small mismatch between the coefficients of thermal expansion still leads to noticeable parasitic stresses at the interface with the optical element.

One material that provides, both, sufficient compliance in a sufficiently matching coefficient of thermal expansion is the so-called Invar material, an iron (Fe) nickel (Ni) alloy (sometimes also referred to as FeNi36 or 64FeNi). Here, however, the issue arises that Invar shows noticeable magnetostriction properties, i.e. dimensional alterations in response to changing magnetic fields, which results in imaging accuracy issues for optical elements located in close proximity to components generating changing magnetic fields. Such a situation may, for example, arise in the above optical imaging arrangements having a large numerical aperture NA, which in many cases involves an optical element located in close proximity to the moving wafer stage. Here, the actuators generating the motion of the wafer stage also generate noticeably fluctuating magnetic fields in the surroundings of the neighboring optical element. As a consequence, here, magnetostriction effects may lead to noticeable parasitic stresses at the interface with the optical element.

SUMMARY

The disclosure seeks to, at least to some extent, overcome the above disadvantages and to provide good and long term reliable imaging properties of an optical imaging arrangement used in an exposure process.

The disclosure seeks to reduce issues, in particular imaging accuracy issues, resulting from parasitic stresses introduced into an optical imaging element of an optical imaging arrangement via their support structure.

According to one aspect, the disclosure includes the technical teaching that an overall reduction of issues, in particular imaging accuracy issues, resulting from parasitic stresses introduced into an optical imaging element of an optical imaging arrangement via their support structure can be achieved, if a connector solution is implemented with a connecting element unit and an additional parasitic load compensation unit located in the vicinity of the interface between the connecting element unit and the component to be supported. The connecting element unit may be configured in a conventional manner to support the component to be supported by introducing corresponding support forces along the support force flow path between its interface sections with the component and the support structure. Here, eventually, the connecting element unit also may provide a certain degree of parasitic deformation decoupling to reduce the thermal expansion induced parasitic loads introduced into the component to a certain level. The parasitic load compensation unit is then located external to the force flow path between the interface sections of the connecting element unit and is configured to (eventually further) reduce and/or counteract the (eventually remaining) parasitic loads introduced into the component to be supported in at least one parasitic load direction.

The additional parasitic load compensation unit located external to the force flow path has the advantage that it may be made from a different material than the connecting element unit, such that a hybrid solution or hybrid connection arrangement may be implemented.

In such a hybrid solution, the connecting element unit may be a unit providing sufficient parasitic deformation decoupling (e.g. via one or more sections which are sufficiently compliant in at least one deformation decoupling direction), while having a certain mismatch in the coefficient of thermal expansion (with respect to the component to be supported). Thanks to the acceptable mismatch in the coefficient of thermal expansion, materials can be used for the connecting element unit, which allow manufacturing or achievement of the compliance for deformation decoupling in a comparatively simple manner.

The parasitic load compensation unit, on the other hand, may be a unit of comparatively simple design (in particular comparatively simple geometry) but with a coefficient of thermal expansion, which closely matches the coefficient of thermal expansion of the component to be supported. Such a parasitic load compensation unit may then be implemented to act on parts of the connecting element unit and/or on parts of the component to be supported in order to generate a counteraction to or a reduction of the parasitic loads stemming from the connecting element unit and introduced into the component. Thanks to the location external to the force flow path and the consequently missing deformation decoupling desired (i.e. the desired to provide parasitic deformation decoupling at the level of the parasitic load compensation unit), the parasitic load compensation unit, as noted above, may have a fairly simple design, such that despite the typically more expensive material (having the desired close match to the coefficient of thermal expansion of the component to be supported, typically a very low or near zero coefficient of thermal expansion) a comparatively inexpensive solution may be achieved.

In other words, with the present disclosure, a hybrid solution can be implemented which, on the one hand, is hybrid in terms of the thermal properties of the connecting unit and the parasitic load compensation unit. On the other hand, the solution can also be hybrid in terms of the parasitic deformation decoupling properties of its units, the connecting element unit providing sufficient compliance for parasitic deformation decoupling, whereas the parasitic load compensation unit doesn't have to provide such parasitic deformation decoupling. To the contrary, typically, the parasitic load compensation unit preferably is a comparatively rigid component in order to generate a comparatively strong counteraction to the parasitic loads (in one or more parasitic load compensation directions) stemming from the connecting element unit.

Preferably, the material of the parasitic load compensation unit, in the respective parasitic load compensation direction, has a rigidity that is at least substantially equal, preferably noticeably higher than the rigidity of the material of the component in the area of interface between the component and the connecting element unit. Preferably, the rigidity of the material of the parasitic load compensation unit, in at least one parasitic load compensation direction, is at least M times the rigidity of the material of the component in the area of the interface between the component and the connecting element unit with M ranging from 0.5 to 10, preferably from 1 to 7 more preferably from 2 to 5. By this approach, particularly good compensation of parasitic loads is achieved, since, due to the superior rigidity, the parasitic load compensation unit absorbs at least a corresponding majority of the parasitic load.

A further considerable advantage of such a hybrid approach is the fact that magnetostriction related issues can be avoided, since the desired properties (namely, parasitic deformation decoupling for the connecting element unit and matching coefficient of thermal expansion for the parasitic load compensation unit) can be achieved using conventional materials not showing noticeable magnetostriction.

Thus, according to a first aspect of the disclosure there is provided a connection arrangement for connecting a component, in particular, an optical component, of an optical imaging arrangement to a support unit of a support structure, including a connecting element unit. The connecting element unit has a support interface end with support interface section and a component interface end with a component interface section. The support interface section is configured to form a support interface for mechanical connection to the support unit, while the component interface section is configured to form a component interface for mechanical connection to the component. The connecting element unit defines a force flow path between the support interface section and the component interface section, wherein support forces supporting the component flow along the force flow path when the component is supported by the support unit via the connecting element unit. At least one parasitic load compensation unit is located in a vicinity of the component interface section and external to the force flow path, and the parasitic load compensation unit is configured to reduce and/or counteract thermal expansion induced parasitic loads introduced in at least one parasitic load direction into the component as a result of thermal expansion of the connecting element unit.

As noted above, the parasitic load compensation unit may act on parts of the connecting element unit and/or on parts of the component to be supported in order to generate a counteraction to or a reduction of the parasitic loads stemming from the connecting element unit and introduced into the component. Hence, with certain embodiments, the at least one parasitic load compensation unit is mechanically connected to the connecting element unit at a parasitic load compensation interface of the component interface end. The parasitic load compensation interface may be located at any suitable location providing proper introduction of the counteraction counteracting the parasitic loads stemming from the connecting element unit. With certain embodiments, the component interface section has a component interface surface and the parasitic load compensation interface has a parasitic load compensation interface surface, wherein the component interface surface, in particular, defines a plane parallel to the at least one parasitic load direction.

Here, with certain embodiments, the component interface surface and the parasitic load compensation interface surface are located on opposite sides of a protrusion of the connecting element unit forming the component interface end. Thus, in a comparatively simple manner, the parasitic load compensation unit may be located, both, external to the force flow path and close to the component interface surface, such that simple and efficient counteraction or compensation of parasitic loads is achieved.

In addition or as an alternative, the parasitic load compensation interface surface is located a circumference, in particular at an outer circumference, of a protrusion of the connecting element unit forming the component interface end. Here, the parasitic load compensation interface can extend transverse to the at least one parasitic load direction, in particular, substantially perpendicular to the at least one parasitic load direction. Here as well, in a comparatively simple manner, the parasitic load compensation unit may be located, both, external to the force flow path and close to the component interface surface, such that simple and efficient counteraction or compensation of parasitic loads is achieved.

It will be appreciated that the connection between the parasitic load compensation unit and the connecting element unit may be implemented in any suitable way, in particular, involving a positive connection, a frictional connection, an adhesive connection and arbitrary combinations thereof. Preferably, the at least one parasitic load compensation unit is connected to the connecting element unit via an adhesive connection, since such a solution allows particularly simple establishment of the connection.

It will be further appreciated that connecting element unit does not necessarily have to be connected exclusively directly to the component to be supported. Rather, with certain embodiments, in addition or as an alternative to such a direct connection, the connecting element unit may be connected to the component to be supported via the respective parasitic load compensation unit. Hence, with certain embodiments, the at least one parasitic load compensation unit is mechanically connected to the component interface end at the component interface, and the at least one parasitic load compensation unit is an intermediate unit forming an intermediate interface, wherein the intermediate interface is configured to link the component to the connecting element unit via the at least one parasitic load compensation unit. Here again, any desired type of connection, including a positive connection, a frictional connection, an adhesive connection and arbitrary combinations thereof, may be implemented. Again, preferably (for the reasons as outlined above), the at least one parasitic load compensation unit is connected to the connecting element unit and/or to the component via an adhesive connection.

Moreover, as outlined above, with certain embodiments, the parasitic load compensation unit (in addition or as alternative) is mechanically connected to the component (to be supported) itself. Hence, with certain variants, the at least one parasitic load compensation unit is mechanically connected to a mounting interface of the component located in a vicinity of the component interface section. Here, it may be provided that the at least one parasitic load compensation unit is not in contact with the connecting element unit. Hence, in other words, the at least one parasitic load compensation unit may act exclusively on the component to be supported, such that the parasitic loads are introduced into the component in the first place but then counteracted by the parasitic load compensation unit acting on the component to achieve an overall reduction of the parasitic stresses propagating (beyond the component interface region) within the component.

Here again, any desired type of connection, including a positive connection, a frictional connection, an adhesive connection and arbitrary combinations thereof, may be implemented. Again, preferably (for the reasons as outlined above), the at least one parasitic load compensation unit is connected to the component via an adhesive connection.

It will be appreciated that, basically, any desired and suitable material may be used for the at least one parasitic load compensation unit as long as it allows achieving a sufficient level of counteraction to or compensation of the parasitic loads introduced into the component to be supported. Apparently, the material is preferably matched to the properties of the material of the component in order to avoid the generation of parasitic loads (introduced into the component) by the parasitic load compensation unit itself.

With certain embodiments, the parasitic load compensation unit includes at least one parasitic load compensation material from a parasitic load compensation material group, the parasitic load compensation material group consisting of a ceramic material, a glass ceramic material, a Cordierite material, a Zerodur® material, a Clearceram® material, an ULE® material, a quartz glass material and combinations thereof. Such materials, typically, have a very low coefficient of thermal expansion, which closely matches the coefficient of thermal expansion used for components such as optical elements used in such optical imaging arrangements (in particular the ones used in microlithography systems).

Basically, any desired and suitable materials may be used for the component to be supported. Preferred materials for such components, in particular, in case of optical elements, may be a ceramic material, a glass ceramic material, a Cordierite material, a Zerodur® material, a Clearceram® material, an ULE® material, a quartz glass material, and combinations thereof.

Furthermore, typically, the parasitic load compensation unit includes at least one parasitic load compensation material and the component includes at least one component material. Here, with certain embodiments achieving a particularly good match of the coefficient of thermal expansion (between the parasitic load compensation unit and the component to be supported), the parasitic load compensation material has a coefficient of thermal expansion which, under normal operating conditions of the optical imaging arrangement (in particular, at the temperature range encountered during normal operation), deviates from a coefficient of thermal expansion of the component material by less than $0.2 \cdot 10^{-6}$ K$^{-1}$, preferably less than $0.15 \cdot 10^{-6}$ K$^{-1}$, more preferably less than $0.1 \cdot 10^{-6}$ K$^{-1}$. Typically, it is preferred that the deviation is as close to zero as possible, preferably at least essentially zero.

It will be appreciated that the normal operating conditions of the optical imaging arrangement (to be expected during regular operation optical imaging arrangement) typically involve a temperature range at or close to room temperature (e.g. at 22° C.±1° C.). However, with other embodiments, other normal operating conditions, in particular other (higher or lower) normal operating temperature ranges may be encountered as well.

Furthermore, with certain embodiments, the parasitic load compensation unit includes at least one parasitic load compensation material having a coefficient of thermal expansion smaller than $2 \cdot 10^{-6}$ K$^{-1}$, preferably smaller than $0.5 \cdot 10^{-6}$ K$^{-1}$, more preferably smaller than $0.1 \cdot 10^{-6}$ K$^{-1}$, more preferably from $-0.1 \cdot 10^{-6}$ K$^{-1}$ to $0.1 \cdot 10^{-6}$ K$^{-1}$.

It will be further appreciated that, basically, any desired and suitable material may be used for the connecting element unit as long as it allows achieving a sufficient level of parasitic deformation decoupling in the involved parasitic deformation decoupling degree(s) of freedom. Preferably, the material is tuned to the desired deformation decoupling properties, while eventually accepting a noticeable mismatch with the coefficient of thermal expansion of the component to be supported.

With certain embodiments, the connecting element unit includes at least one connecting element material from a connecting element material group, the connecting element material group consisting of a metal material, a titanium (Ti) material, an Invar material, a stainless steel material, a copper (Cu) material, an aluminum (Al) material, a stainless steel material, alloys thereof and combinations thereof. As outlined above, such materials provide fairly simple handling during manufacture and allow easier implementation of compliant sections of the connecting element unit providing the desired degree of parasitic deformation decoupling in one or more degrees of freedom. With certain embodiments, eventually, also composite materials could be used (typically provided that they have a suitable coating preventing contamination).

As outlined above, preferably, the connecting element unit and/or the parasitic load compensation unit includes at least one non-magnetostrictive material. It will be appreciated that a non-magnetostrictive material in the sense of the present application is a material that is matched to the actual application of the connection arrangement and, under the maximum alteration of the magnetic field to be expected at the respective location during operation of the optical imaging arrangement, shows magnetostriction-related alterations in its geometry, which do not go beyond 1 ppm, preferably not beyond 0.1 ppm, more preferably not beyond 0.01 ppm.

As outlined above, preferably, the parasitic load compensation unit is a comparatively rigid component in the parasitic load direction, this rigidity, in certain cases, being considerably higher than the rigidity of the connecting element unit. Hence, with certain embodiments, the connecting element unit has a connecting element unit rigidity in the parasitic load direction and the parasitic load compensation unit has a parasitic load compensation unit rigidity in the parasitic load direction, the parasitic load compensation unit rigidity being N times the connecting element unit rigidity with N ranging from 100000 to 0.1, preferably from 50000 to 0.5 more preferably from 20000 to 1. In some cases N may be about 20000 to 500. Any of the above configurations may be particularly helpful in achieving, both, good parasitic deformation decoupling (thanks to the decoupling properties of the connecting element unit) and low parasitic loads introduced into the component to be supported (thanks to the action of the parasitic load compensation unit).

For similar reasons, with certain embodiments, the connecting element unit has a connecting element unit rigidity in the at least one parasitic load direction, the connecting element unit rigidity being 1 N/mm to 100000 N/mm, preferably 2 N/mm to 50000 N/mm more preferably 5 N/mm to 20000 N/mm. Similarly, in addition or as alternative, the parasitic load compensation unit can have a parasitic load compensation unit rigidity in the at least one parasitic load direction, the parasitic load compensation unit rigidity being 1 N/mm to 500000 N/mm, preferably 2 N/mm to 200000 N/mm, more preferably from 5 N/mm to 100000 N/mm. It will be appreciated that these rigidities are related to the outer diameter or circumference of the connecting element unit and the parasitic load compensation unit, respectively.

It will be appreciated in this context that, in particular, depending on the rigidity of the connecting element unit, with certain embodiments with low rigidity of the connecting element unit, the parasitic load compensation unit rigidity may as well be comparatively low, typically 1 N/mm to 50 N/mm, preferably 5 N/mm to 35 N/mm, more preferably 15 N/mm to 30 N/mm. On the other hand, with certain embodiments with higher rigidity of the connecting element unit, the parasitic load compensation unit rigidity may as well have a higher rigidity, typically 1000 N/mm to 50000 N/mm, preferably 5000 N/mm to 35000 N/mm, more preferably 15000 N/mm to 30000 N/mm.

As noted above, preferably, the material of the parasitic load compensation unit matches the properties of the component to be supported. Hence, with certain embodiments, the component has a connecting element interface for connecting the component to the connecting element unit, and the component at least at the connecting element interface is made of a component material. The parasitic load compensation unit is made of a parasitic load compensation material, wherein, during normal operation (i.e. in a temperature range to be expected during operation of the arrangement) a deviation of a coefficient of thermal expansion of the parasitic load compensation material and the component material is less than 1000%, preferably less than 100% more preferably less than 10% to 1%, of a coefficient of thermal expansion of the component material. By this approach, parasitic loads introduced into the component as a result of a thermal property mismatch between the parasitic load compensation unit and the component may be at least largely avoided.

As noted above, in addition or as alternative, the material of the parasitic load compensation unit, in the respective parasitic load compensation direction, preferably has a rigidity that is at least substantially equal, preferably noticeably higher than the rigidity of the material of the component in the area of interface between the component and the connecting element unit. Preferably, the rigidity of the material of the parasitic load compensation unit, in at least one parasitic load compensation direction, is at least M times the rigidity of the material of the component in the area of the interface between the component and the connecting element unit with M ranging from 0.5 to 10, preferably from 1 to 7 more preferably from 2 to 5. By this approach, particularly good compensation of parasitic loads is achieved, since, due to the superior rigidity, the parasitic load compensation unit absorbs at least a corresponding majority of the parasitic load.

It will be appreciated that, as outlined above, the connecting element unit preferably provides sufficient parasitic deformation decoupling in order to reduce the level of parasitic loads introduced into the component. Such parasitic deformation decoupling may be achieved in any desired and suitable way. Preferably, such parasitic deformation decoupling in at least one parasitic deformation decoupling direction is achieved by one or more compliant sections of the connecting element unit providing a sufficiently high compliance in the respective direction of parasitic deformation decoupling. Hence, with certain embodiments, the connecting element unit includes a deformation decoupling section located, along the force flow path, between the support interface section and the component interface section, wherein the deformation decoupling section is configured to compensate for differences in thermal expansion of the connecting element unit and the component in at least one deformation decoupling direction by elastic deformation of the deformation decoupling section.

It will be appreciated that the deformation decoupling section may have any desired and suitable design to provide sufficient compliance. With certain embodiments, the deformation decoupling section includes at least one spring element, which is elastically deflected to compensate for the differences in thermal expansion. The respective spring element may have any desired and suitable design and configuration, respectively. With certain preferred variants of particularly simple design, the at least one spring element is a leaf spring element, the leaf spring element, in particular, defining a longitudinal leaf spring axis and being elastically deflected in a bending mode about a bending axis extending perpendicular to a bending plane defined by the longitudinal leaf spring axis and the deformation decoupling direction.

In addition or as alternative, the deformation decoupling section may include at least one spring section, which is elastically deflected to compensate for the differences in thermal expansion, wherein the at least one spring section, in particular, has a substantially U-shaped cross section in a sectional plane including the deformation decoupling direction. By this approach, a particularly efficient yet simple and space-saving configuration may be achieved.

It will be appreciated that the connection arrangement may be configured such that, upon alterations in the temperature distribution within the arrangement, a certain alteration in the position and/or orientation of the component and the support structure may be accepted. Such alterations, in particular, may be accepted in degrees of freedom having a negligible influence on the optical imaging error of the optical imaging arrangement. Preferably, however, with certain embodiments, such thermally induced alterations are at least largely avoided by a suitable athermal design providing sufficient thermal stability in this respect.

Hence, with certain embodiments, the connecting element unit is an athermal unit, which defines at least one direction of athermality and is configured to provide an athermality function by keeping a variation in a distance between the support interface and the component interface along the at least one direction of athermality below 0.1 μm, preferably below 0.01 μm, more preferably below 0.001 μm, per Kelvin in temperature difference. It will be appreciated that the temperature difference, here, designates a (global) increase in the temperature in the arrangement.

It will be appreciated that any desired and suitable configuration may be implemented to provide such an athermality function to a sufficient extent. With certain embodiments, such an athermality function is achieved in that the support interface defines a support interface plane and the component interface defines a component interface plane, the component interface plane is substantially parallel to the support interface plane, the connecting element unit being configured such that, per Kelvin of temperature difference and a meter of distance between the support interface and the component interface along the force flow path, a distance between the support interface plane and the component interface plane varies by less than 10 μm, preferably less than 1 μm, more preferably less than 0.1 μm;

in addition or as an alternative, such an athermality function is achieved in a particularly simple manner in that the support interface defines a support interface plane and the component interface defines a component interface plane, and the component interface plane, at least in one operating state of the optical imaging arrangement, in particular in a stationary state during the exposure operation of the optical imaging arrangement, substantially coincides with the support interface plane. In such a case, thermal expansion of the connecting element unit does not lead to a shift between the component interface plane and the support interface plane in a direction perpendicular to these planes. Hence, a particularly simple configuration may be achieved.

In addition or as alternative, it may be provided that the connecting element unit, along the force flow path from the component interface to the support interface, has a first thermal expansion section thermally expanding in a first direction and a subsequent second thermal expansion section thermally expanding in a second direction opposite to the first direction, a geometry, in particular a length along the force flow path, of the first and second thermal expansion section being selected to provide the athermality function. Here as well, particularly simple and efficient athermal configuration may be achieved.

It will be appreciated that than any desired and suitable design may be provided for the connecting element unit in order to achieve the desired support and parasitic deformation decoupling functionality. For example, the connecting element unit may be a simple bracket element or arm element connecting the component to the support structure.

With certain embodiments, the connecting element unit is a bush element defining an axial direction, a radial direction and a circumferential direction, and the component interface end is formed at a radial protrusion of the bush element protruding radially outward in the radial direction. By this approach, a particularly simple configuration may be achieved, which may also take advantage of the fact that, among others via symmetry features of such a bush element, thermally induced alterations in the position and/or orientation between the support structure and the component may be at least largely avoided.

Hence, with certain embodiments, the bush element is substantially rotationally symmetric about the axial direction. Such a configuration, has the advantage that it yields such spatial stability in a plane perpendicular to the axial direction during alterations in the temperature distribution within the arrangement.

With certain particularly simple to implement embodiments, the component interface is formed at a surface of the radial protrusion facing in the axial direction and/or at a surface of the radial protrusion facing in the radial direction. By this approach, particularly simple and convenient manufacture and handling, in particular accessibility, of the interfaces is achieved.

It will be appreciated that the radial protrusion may be only extends over a certain fraction of the circumference of the bush element. Preferably, the radial protrusion, in the circumferential direction, extends over substantially an entire circumference of the bush element.

With certain embodiments, the radial protrusion has a segmented design and includes a plurality of K protrusion segments, wherein two adjacent protrusion segments are separated, in the circumferential direction, by a slot within the bush element. Any desired number K of segments may be provided. Preferably, K is larger than 2, preferably larger than 5, more preferably ranges from 8 to 20, thereby achieving particularly beneficial configurations, in particular having good parasitic deformation decoupling properties in multiple degrees of freedom.

With a certain embodiments, the bush element includes a deformation decoupling section, which includes at least one spring section, which, in particular, has a substantially U-shaped cross section in a sectional plane including the axial direction. The substantially U-shaped cross section can have a first leg contacting the support interface section and a second leg contacting the component interface section. By this approach, particularly simple parasitic deformation decoupling is achieved in the sectional plane including the axial direction.

With certain embodiments, the bush element includes a deformation decoupling section, which has a segmented design and includes a plurality of K deformation decoupling segments, wherein two adjacent deformation decoupling segments are separated, in the circumferential direction, by a slot within the bush element. Again, preferably, K is larger than 2, preferably larger than 5, more preferably ranges from 8 to 20, thereby achieving particularly beneficial configurations, in particular having good parasitic deformation decoupling properties in multiple degrees of freedom.

Will be appreciated that the support interface of the bush element may have any desired and suitable design, which allows proper connection to the support structure. Preferably, the support interface is formed at a ring shaped or disc shaped base section of the bush element, thereby achieving a particularly simple yet efficient and easily accessible support interface.

It will be appreciated that the parasitic load compensation unit may have any desired and suitable design allowing the introduction of compensating forces and/or moments into the connecting element unit and/or the components to be supported. Preferably, the parasitic load compensation unit extends in a circumferential direction of the connecting element unit. This allows proper and efficient introduction of such compensating forces and/or moments.

With certain embodiments, the parasitic load compensation unit includes at least one element forming a ring segment; the ring segment, in particular, connecting at least two mutually separated adjacent segments of the component interface section. By this approach, suitable compensating forces and/or moments may be introduced into the connecting element unit.

With certain embodiments, the parasitic load compensation unit includes at least one ring element extending along an outer circumference of the connecting element unit; the ring element, in particular, connecting a plurality of mutually separated segments of the component interface section. By this approach, with a particularly simple design, an efficient introduction of compensating forces and/or moments into the connecting element unit and/or the components to be supported may be achieved.

The disclosure further relates to an optical imaging arrangement for executing an optical imaging process, including a component, in particular, an optical component, and a support structure, wherein the component and the support structure are connected by at least one connection arrangement according to the disclosure. With this optical imaging arrangement, the variants and advantages as outlined above in the context of the connection arrangement according to the present disclosure may be achieved to the same extent, such that insofar explicit reference is made to the statements made in the foregoing.

It will be appreciated that any desired component having an influence on the optical imaging accuracy of the optical imaging process may on the component supported by the support structure. Particularly beneficial results are achieved, if the component is an optical unit. The optical unit may be any desired unit optically participating in the optical imaging process. Preferably, the optical unit includes an optical element configured to participate in the optical imaging process. Such an optical unit may, for example, be formed exclusively by the optical element. With other variants, the optical unit includes further components, such as a holding device of such an optical element.

It will be appreciated that the present disclosure may be used in the context of any desired optical imaging process operating with imaging light at any desired wavelength. Particularly beneficial effects are achieved in the context of so-called VUV lithography and EUV lithography. Hence, preferably, the optical imaging arrangement is configured to be used in microlithography using exposure light at an exposure light wavelength in a UV range, in particular, in one of a VUV range and an EUV range. Here, preferably, the exposure light has an exposure light wavelength ranging from 100 nm to 200 nm (VUV range) or from 5 nm to 20 nm (EUV range).

With certain variants, the optical imaging arrangement includes an illumination unit, a mask unit, an optical projection unit and a substrate unit, the illumination unit being configured to illuminate a mask received by the mask unit with the exposure light, the optical projection unit being configured to transfer an image of a pattern formed on the mask onto a substrate received by the substrate unit. The optical unit then forms part of the illumination unit or the optical projection unit. Of course, a corresponding configuration may be chosen for both optical units in the illumination unit and the optical projection unit.

According to a second aspect of the disclosure there is provided a method of connecting a component, in particular, an optical component, of an optical imaging arrangement to a support unit of a support structure. The method includes providing a connecting element unit, which has a support interface end with support interface section and a component interface end with a component interface section, wherein the connecting element unit defines a force flow path between the support interface section and the component interface section. The method further includes mechanically connecting a support interface of the support interface section to the support unit and mechanically connecting a component interface of the component interface section to the component, such that support forces supporting the component flow along the force flow path. At least one parasitic load compensation unit is located in a vicinity of the component interface section and external to the force flow path, wherein the parasitic load compensation unit reduces and/or counteracts thermal expansion induced parasitic loads introduced in at least one parasitic load direction into the component as a result of thermal expansion of the connecting element unit.

With this method, the variants and advantages as outlined above in the context of the connection arrangement according to the present disclosure may be achieved to the same extent, such that insofar explicit reference is made to the statements made in the foregoing.

Preferably, the at least one parasitic load compensation unit is mechanically connected to the connecting element unit at a parasitic load compensation interface of the component interface end to yield the corresponding configuration as it has been outlined above. In addition or as alternative, the at least one parasitic load compensation unit is mechanically connected to the component interface end at the component interface, and the at least one parasitic load compensation unit is an intermediate unit linking the component to the connecting element unit via the at least one parasitic load compensation unit. This yields in the corresponding configuration as it been described above in greater detail. In addition or as an alternative, the at least one parasitic load compensation unit is mechanically connected to a mounting interface of the component located in a vicinity of the component interface section, which yields a further configuration as it has been outlined above in greater detail.

As has already been outlined in greater detail above, with certain embodiments, a deformation decoupling section of the connecting element unit located, along the force flow path, between the support interface section and the component interface section compensates for differences in thermal expansion of the connecting element unit and the component in at least one deformation decoupling direction by elastic deformation. In addition or as an alternative, the connecting element unit may provide an athermality function in at least one direction of athermality by keeping a variation in a distance between the support interface and the component interface along the at least one direction of athermality below 0.1 µm, preferably below 0.01 µm, more preferably below 0.001 µm, per Kelvin in temperature difference. Such a variant yields the corresponding advantages as they have been described in greater detail in the foregoing.

Finally, according to a further aspect, the present disclosure relates to an optical imaging method, wherein in an exposure process using exposure light, an image of a pattern is transferred, onto a substrate using an optical imaging arrangement, in particular, an optical imaging arrangement according to the disclosure. Preferably, during the exposure process, an optical unit of the optical imaging arrangement is supported using a method according to the present disclosure.

With this method, the variants and advantages as outlined above in the context of the arrangements and methods according to the present disclosure may be achieved to the same extent, such that insofar explicit reference is made to the statements made in the foregoing.

Further aspects and embodiments of the disclosure will become apparent from the dependent claims and the following description of preferred embodiments which refers to the appended figures. All combinations of the features disclosed, whether explicitly recited in the claims or not, are within the scope of the disclosure.

BRIEF DESCRIPTION OF THE DRAWINGS

FIG. 3 is a schematic perspective representation of a part of the connection arrangement of FIG. 2.

FIG. 4 is a block diagram of a preferred embodiment of an optical imaging method according to the disclosure including a preferred embodiment of a method of tempering an optical unit according to the disclosure which may be executed with the optical imaging arrangement of FIG. 1.

FIG. 5 is a schematic sectional representation of a part of a further preferred embodiment of the connection arrangement according to the disclosure.

DETAILED DESCRIPTION OF THE DISCLOSURE

First Embodiment

In the following, a first preferred embodiment of an optical imaging arrangement 101 according to the disclosure including a preferred embodiment of a connection arrangement according to the disclosure will be described with reference to FIGS. 1 to 4. It will be appreciated that preferred embodiments of the methods according to the disclosure can be implemented using the optical imaging arrangement 101. To facilitate understanding of the following explanations a xyz coordinate system is introduced in the Figures, wherein the z-direction designates the vertical direction (i.e. the direction of gravity). It will, however, be appreciated that, with other embodiments of the disclosure, any other spatial arrangement of the components of the optical imaging arrangement 101 may be selected.

Figure 1:
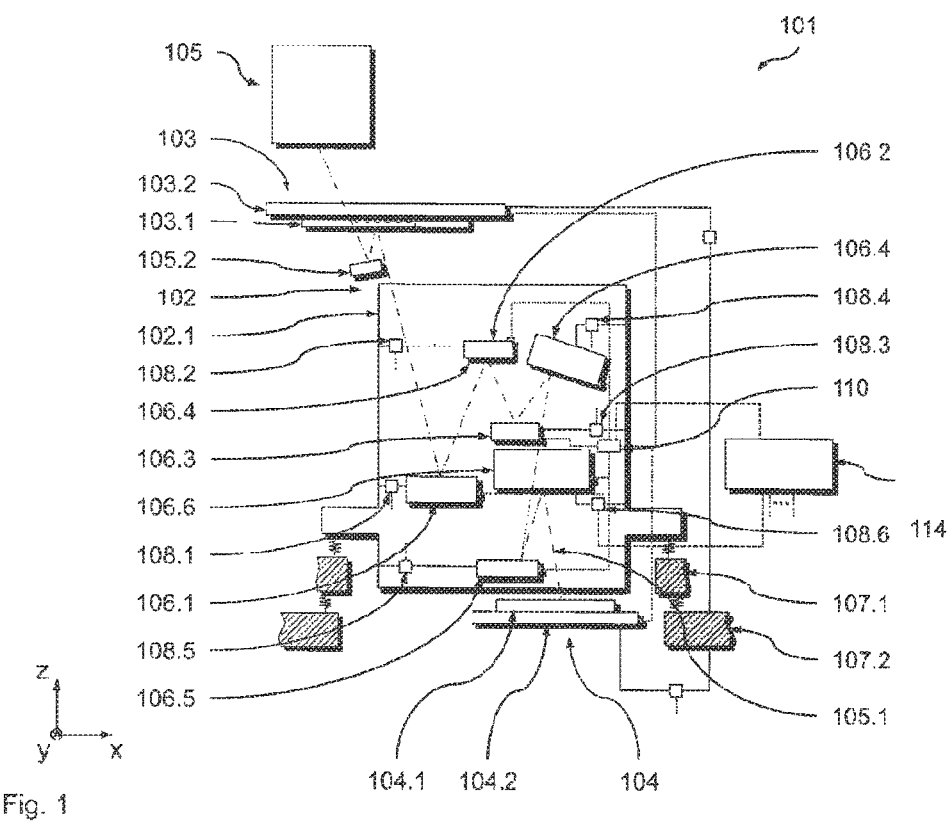
FIG. 1 is a schematic, partially sectional representation of a preferred embodiment of an optical imaging arrangement according to the disclosure including a preferred embodiment of a connection arrangement according to the disclosure with which preferred embodiments of methods according to the disclosure may be executed.

FIG. 1 is a highly schematic and not-to-scale representation of the optical imaging arrangement in the form of an optical exposure apparatus 101 operating in the EUV range at a wavelength of 13 nm. The optical exposure apparatus 101 includes an optical projection unit 102 adapted to transfer an image of a pattern formed on a mask 103.1 (located on a mask table 103.2 of a mask unit 103) onto a substrate 104.1 (located on a substrate table 104.2 of a substrate unit 104). To this end, the optical exposure apparatus 101 includes an illumination system 105 illuminating the reflective mask 103.1 with exposure light (represented by its chief ray 105.1) via an appropriate light guide system 105.2. The optical projection unit 102 receives the light reflected from the mask 103.1 and projects the image of the pattern formed on the mask 103.1 onto the substrate 104.1, e.g. a wafer or the like.

To this end, the optical projection unit 102 holds an optical element unit group 106 of optical element units 106.1 to 106.6. This optical element unit group 106 is held within an optical element support structure 102.1. The optical element support structure 102.1 may take the form of a housing structure of the optical projection unit 102, which, in the following, is also referred to as the projection optics box structure (POB) 102.1. It will be appreciated, however, that this optical element support structure does not necessarily have to form a complete or even (light and/or fluid) tight enclosure of the optical element unit group 106. Rather it may also be partially formed as an open structure as it is the case with the present example.

It will be appreciated that, in the sense of the present disclosure, an optical element unit may merely consist of an optical element, such as a mirror. However, such an optical element unit may also include further components such as a holder holding such an optical element. Likewise, the optical element itself not necessarily has to be a monolithic component, but may consist of one or more components.

The projection optics box structure 102.1 is supported in a vibration isolated manner on a load bearing structure 107.1, which in turn, is supported on a ground or base structure 107.2. The load bearing structure 107.1 is supported on the ground or base structure 107.2 in a vibration isolated manner at a vibration isolation resonant frequency that ranges from 0.05 Hz to 8.0 Hz, preferably from 0.1 Hz to 1.0 Hz, more preferably from 0.2 Hz to 0.6 Hz. Furthermore, typically, a damping ratio is selected that ranges from 5% to 60%, preferably from 10% to 30%, more preferably from 20% to 25%. In the present example a vibration isolation resonant frequency of 0.25 Hz to 2 Hz at a damping ratio of 15% to 35% is selected for the vibration isolated support of the load bearing structure 107.

The ground or base structure 107.2 (in a vibration isolated manner) also supports the mask table 103.2 via a mask table support device 103.3 and the substrate table 104.2 via a substrate table support device 104.3. It will be appreciated however that, with other embodiments of the disclosure, the load bearing structure 107.1 may also support (preferably in a vibration isolated manner) the mask table 103.2 and the substrate table 104.2.

It will be appreciated that the projection optics box structure 102.1 may be supported in a cascaded manner via a plurality of vibration isolation devices and at least one intermediate support structure unit to achieve good vibration isolation. Generally, these vibration isolation devices may have different isolation frequencies to achieve good vibration isolation over a wide frequency range.

The optical element unit group 106 includes a total of six optical element units, namely a first optical element unit 106.1, a second optical element unit 106.2, a third optical element unit 106.3, a fourth optical element unit 106.4, a fifth optical element unit 106.5 and a sixth optical element unit 106.6. In the present embodiment, each of the optical element units 106.1 to 106.6 includes an optical element in the form of a mirror, also referred to as mirrors M1 to M6 in the following.

It will be further appreciated that, with other embodiments of the disclosure, another number of optical element units may be used. Preferably, four to eight optical element units are provided.

The ongoing miniaturization of semiconductor devices to be manufactured using the imaging apparatus 101, and, hence, the advanced desired properties regarding the optical resolution of the imaging apparatus 101 leads to very strict desired properties with respect to the relative position and/or orientation between the components of the optical imaging apparatus 101 participating in the exposure process as well as the deformation of the individual components throughout the entire imaging process.

To fulfill these increasingly stricter desired properties even under the influence of mechanical disturbances, such as vibrations, it is typically desirable to at least intermittently capture the spatial relationship between certain components of the optical imaging arrangement 101 and to adjust the position of at least one of the components of the optical imaging arrangement 101 as a function of the result of this capturing process. Similar applies to the deformation of at least some of these components of the optical imaging arrangement 101.

Such active solutions, however, typically involve active systems including a large number of actuators and sensors etc. Heat dissipation of these components increasingly aggravates thermal issues arising in the imaging arrangement 101, especially if these components are located inside the projection optics box structure (POB) 102.1 in close proximity to the optical element units 106.1 to 106.6.

As a result, particular care has to be taken as regards the support of the individual optical element unit 106.1 (M1) to 106.6 (M6). In the present example, each one of the mirrors 106.1 (M1) to 106.6 (M6) is supported on the support structure formed by the projection optics box structure 102.1 by an associated support device 108.1 to 108.6. Each one of the support devices 108.1 to 108.6 may be formed as an active device such that, in this case, each of the mirrors 106.1 to 106.6 is actively supported at a defined control bandwidth. It will be further appreciated that, with other embodiments of the disclosure, none or only a part of the mirrors 106.1 (M1) to 106.6 (M6) may be actively supported.

Figure 2:
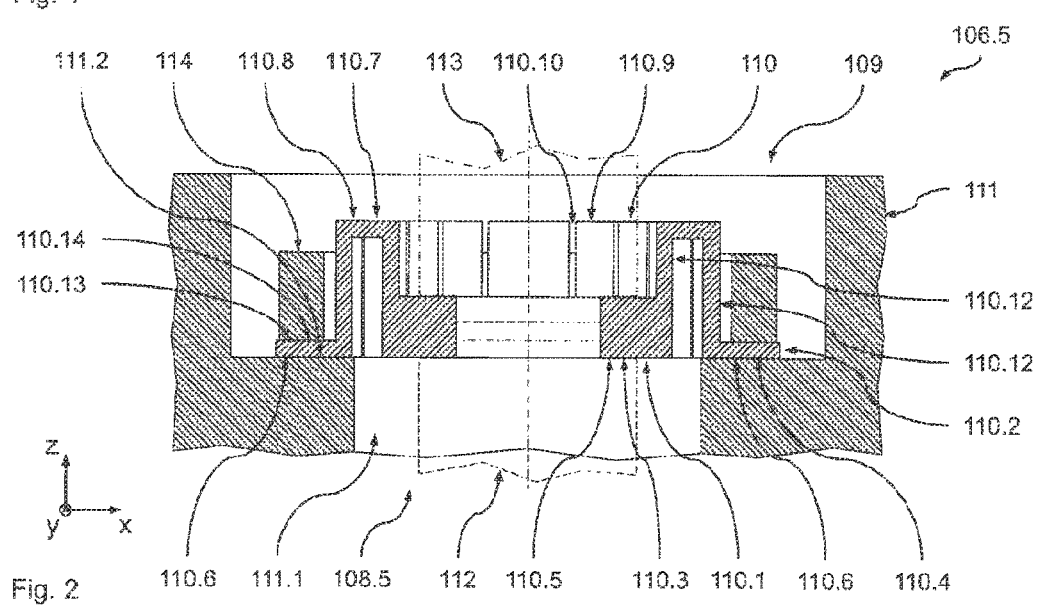
FIG. 2 is a schematic sectional representation of a part of the optical imaging arrangement of FIG. 1 showing the connection arrangement.

As will be explained by way of example of the support device 108.5 of the optical element unit 106.5, in the present embodiment, to achieve long-term thermally stable support of the optical element units 106.1 to 106.6, one or more (up to all) of the support devices 108.1 to 108.6 includes a preferred embodiment of the connection arrangement 109 according to the disclosure as it is schematically shown in FIG. 2.

As can be seen from FIG. 2, the connection arrangement 109 includes a connecting element unit 110 mechanically connecting the optical element body or mirror body 111 (forming a component in the sense of the disclosure) to a (passive or active) support unit 112 of the support structure 102.1. In other words, the support forces for supporting the optical element unit 106.5 are introduced into the optical element unit 106.5 from the support unit 112 via the connecting element unit 110.

To this end, as can be seen from FIGS. 2 and 3, in the present example, the connecting element unit 110 is a substantially bush shaped element, which has a support interface end 110.1 and a component interface end 110.2. The connecting element unit 110 defines an axial direction AD (parallel to the z-direction in FIG. 2), a radial direction RD (lying in the xy-plane in FIG. 2 and, in one case, parallel to the x-direction in FIG. 2) and a circumferential direction CD (lying in the xy-plane in FIG. 2 and extending along the circumference of the connecting element unit 110). The component interface end 110.2 is formed at or by a radial protrusion of the bush element 110 protruding radially outward in the radial direction RD. The support interface end 110.1 is formed by a ring shaped base section of the bush element 110.

The support interface end 110.1 has a support interface section 110.3, while the component interface end 110.2 has a component interface section 110.4. The support interface section 110.3 forms a support interface 110.5 for mechanical connection to the support unit indicated by the dashed contour 112, which, in the present example, reaches through a recess 111.1 in the optical element body 111. The component interface section 110.4, on the other hand, forms a component interface 110.6 for mechanical connection to a connecting element interface 111.2 of the component formed by the optical element body 111. The connecting element interface 111.2 is formed at a step within recess 111.1.

It will be appreciated that, with other embodiments, any other desired and suitable arrangement of the connecting element unit 110, the mirror body 111, the support unit 112 and the respective interfaces may be selected. In particular, the recessed design of the optical element body 111 may be dispensed with. For example, a simple planar interface at an outer surface of the optical element body 111 may be sufficient, provided that the support interface end 110.1 has sufficient freedom to move with respect to the optical element body 111. Moreover, as an alternative, for example, the support unit could be connected to the connecting element unit from the other side (as is indicated by double-dot-dashed contour 113 in FIG. 2).

As can be seen from FIG. 2, the connecting element unit 110 defines a force flow path FFP between the support interface section 110.3 and the component interface section 110.4. The support forces SF for supporting the optical element unit 106.5 flow along the force flow path FFP when the optical element unit 106.5 is supported by the support unit 112 via the connecting element unit 110.

As noted above, basically, any desired and suitable materials may be used for optical element body 111 of the optical element unit 106.5 (i.e. the component to be supported in the present example). In the present example, the optical element body 111 is made of a Zerodur® material as provided by SCHOTT AG, 55122 Mainz, Del. However, with other embodiments, different materials may be selected for the component to be supported. For example, preferred materials for such an optical element body 111 may be a ceramic material, a glass ceramic material, a Cordierite material, a Zerodur® material, a Clearceram® material, an ULE® material, a quartz glass material, and combinations thereof.

One of the reasons for selecting such materials for the optical element body 111 is the fact that they have a very low coefficient of thermal expansion (CTE-OE), which is intended to provide long-term thermal dimensional and geometric stability, respectively, of the optical surface of the optical element unit 106.5 under varying thermal boundary conditions.

A drawback of these materials for the optical element body 111 is that they are comparatively expensive and sensitive. Hence, typically, not least for cost and/or handling reasons, the material for at least the majority of the components of the support structure 102.1 (typically including the support device 112) is a less expensive and less sensitive material, such as a metal material (e.g. a steel material).

However, most of these materials suitable for the support structure 102.1 have a coefficient of thermal expansion (CTE-SS), which noticeably deviates from the coefficient of thermal expansion (CTE-OE) of the optical element body 111. As a consequence, a different degree of thermal expansion of the support structure 102.1 and the connected optical element body 111 results from a change in the temperature distribution within the support structure 102.1 and/or the optical element unit 106.5.

Such a different degree of thermal expansion (or differential thermal expansion, respectively) not only potentially leads to an alteration in the position and/or orientation of the optical element unit (in up to all six degrees of freedom). It may also lead to the introduction of parasitic loads via the connecting element unit 110 into the optical element body 111, which cause an undesired deformation of the optical surface of the optical element unit 106.5. In particular, among others, differential thermal expansion of the connecting element unit 110 and the optical element body 111 may lead to such parasitic loads PL introduced into the optical element body 111 and resulting in parasitic stresses PS propagating within the optical element body 111, thereby generating parasitic deformation of the optical element body 111.

As can be seen from FIG. 2, in order to reduce the level of the parasitic loads PL acting on the optical element body 111 due to the differential thermal expansion, in the present example, the connecting element unit 110 provides parasitic deformation decoupling. In the present embodiment, such parasitic deformation decoupling is provided in at least the radial direction RD (as one such parasitic deformation decoupling direction DDD) by a compliant section 110.7 of the connecting element unit 110. This compliant section 110.7 provides sufficiently high compliance the radial direction RD as one direction of parasitic deformation decoupling.

The compliant section 110.7 forms a deformation decoupling section located, along the force flow path FFP, between the support interface section 110.3 and the component interface section 110.4. The deformation decoupling section 110.7 compensates for differences in thermal expansion of the connecting element unit 110 and the optical element unit 106.5 in at the radial direction RD by elastic deformation of the deformation decoupling section 110.7.

As can be seen from FIG. 2, in the present example, the deformation decoupling section 110.7 includes a spring section 110.8, which is elastically deflected to compensate for the differences in thermal expansion (of the support structure 102.1 and the optical element body 111). As can be seen from FIG. 2, the spring section 110.8 may have a substantially U-shaped cross section in a sectional plane including the deformation decoupling direction DDD (here, the radial direction RD), such that a particularly efficient yet simple and space-saving configuration may be achieved.

As can be seen from FIG. 3, in the present example, the deformation decoupling section 110.7 has a segmented design including a plurality of K=12 deformation decoupling segments 110.9, wherein two adjacent deformation decoupling segments 110.9 are separated, in the circumferential direction, by a slot 110.10 within the connecting element unit 110. Each slot 110.10 extends in a plane including the axial direction AD of the connecting element unit 110.

In the present example, the radial protrusion of the connecting element unit 110 forming the component interface end 110.2 also has a segmented design including a plurality of K=12 protrusion segments 110.11 separated by the slots 110.10. It will, however, be appreciated that, with other embodiments, such a segmentation may also be missing (i.e. the radial protrusion may be formed as a continuous ring). Likewise, another degree of segmentation may be selected, i.e. a different number of slots between the protrusion segments 110.11 may be selected, such that adjacent deformation decoupling segments 110.9 may be connected via a protrusion segment 110.11.

In the present example, sufficient compliance in the deformation decoupling direction is provided in that each U-shaped deformation decoupling segment 110.9 of the deformation decoupling section 110.7 includes two leaf spring elements 110.12 (forming the legs of the U), which are elastically deflected to compensate for the differences in thermal expansion. Each leaf spring element 110.12 defines a longitudinal leaf spring axis LLSA extending parallel to the axial direction AD. Hence, each leaf spring element 110.12 is elastically deflected in a bending mode about a bending axis BA extending perpendicular to a bending plane BP defined by the longitudinal leaf spring axis LLSA and the deformation decoupling direction DDD.

As noted above, basically, any desired and suitable material may be used for the connecting element unit 110 as long as it allows achieving a sufficient level of parasitic deformation decoupling in the involved parasitic deformation decoupling degree(s) of freedom. Preferably, the connecting element unit material is tuned to the desired deformation decoupling properties, while eventually accepting a noticeable mismatch with the coefficient of thermal expansion of the component to be supported.

In the present example, the connecting element unit 110 is made from a metal material, namely a titanium (Ti) material, as the connecting element material. In any case, suitable connecting element materials may be selected from a connecting element material group consisting of a metal material, a titanium (Ti) material, an Invar material, a stainless steel material, a copper (Cu) material, an aluminum (Al) material, a stainless steel material, alloys thereof and combinations thereof. As outlined above, such materials provide fairly simple handling during manufacture and allow simple implementation of the compliant section 110.7 of the connecting element unit 110 providing the desired degree of parasitic deformation decoupling in one or more degrees of freedom.

Apparently, the compliant section 110.7 provides deformation decoupling properties by elastic deformation and, hence, reduces the level of the thermal expansion induced parasitic loads PL introduced into the optical element body 111 via the component interface section 110.4. Nevertheless, it will be appreciated that this elastic deformation still generates elastic resetting forces and/or moments, which are still introduced into the optical element body 111 as parasitic loads PL via the component interface section 110.4.

In order to at least reduce or counteract these parasitic loads PL introduced into the optical element body 111 via the component interface section 110.4, the connection arrangement 109 includes a parasitic load compensation unit 114, which is located in a vicinity of the component interface section 110.4 and external to the force flow path FFP. The parasitic load compensation unit 114 reduces and/or counteracts such thermal expansion induced parasitic loads PL introduced in at least one parasitic load direction PLD (e.g. the radial direction RD) into the component as a result of thermal expansion of the connecting element unit 110 (more generally, differential thermal expansion between the support structure 102.1 and the optical element unit 106.5).

As can be seen from FIGS. 2 and 3, in the present example, the parasitic load compensation unit 114 is a ring shaped element mechanically connected to the connecting element unit 110 at a parasitic load compensation interface 110.13 of the component interface end 110.2. In the present example, the parasitic load compensation interface surface 110.14 of the parasitic load compensation interface 110.13 is formed at the radial protrusion forming the component interface section 110.4.

More precisely, the component interface surface 110.6 and the parasitic load compensation interface surface 110.14 are located on opposite sides of the protrusion of the connecting element unit 110 forming the component interface end 110.2. Thus, in a comparatively simple manner, the parasitic load compensation unit 114 may be located, both, external to the force flow path FFP and close to the component interface surface 110.6, such that simple and efficient counteraction or compensation of parasitic loads PL is achieved, respectively.

Furthermore, in the present example, the component interface surface 110.6 and the parasitic load compensation interface surface 110.14, both, define a plane parallel to the at least one parasitic load direction PLD. With other embodiments, however, the respective plane of the component interface surface 110.6 and the parasitic load compensation interface surface 110.14 may also be inclined with respect to each other and/or with respect to the at least one parasitic load direction PLD (in some cases, for example from 1° to 60°, in particular, 15° to 45°).

The additional parasitic load compensation unit 114 located external to the force flow path FFP has the advantage that it may be made from a different material than the connecting element unit 110, such that a hybrid solution or hybrid connection arrangement 109 may be implemented.

In such a hybrid solution, the connecting element unit 110, as outlined above, provides sufficient parasitic deformation decoupling, while having a certain mismatch in the coefficient of thermal expansion CTE with respect to the optical element body 111. Thanks to the acceptable mismatch in the coefficient of thermal expansion CTE, materials can be used for the connecting element unit 110, which allow simple and less costly manufacture.

It will be appreciated that, thanks to the location external to the force flow path FFP and the (consequently) missing deformation decoupling involved, the parasitic load compensation unit 114, as with the present example, may be a unit of comparatively simple design, the material of which closely matches the properties, in particular the thermal properties, of the optical element body 111. More precisely, in the present example, is a deviation between the coefficient of thermal expansion CTE-PLCU of the parasitic load compensation unit 114 and the coefficient of thermal expansion CTE-OEB of the optical element body material of the optical element body 111 is less than 1000%, preferably less than 100%, more preferably less than 10% to 1%, of the coefficient of thermal expansion CTE-OEB of the optical element body material.

In the present example, to achieve a particularly good match of the coefficient of thermal expansion between the parasitic load compensation unit 114 and the optical element body 111, the coefficient of thermal expansion CTE-PLCU, under normal operating conditions of the optical imaging arrangement 101 (in particular, at the temperature range encountered during normal operation of the optical imaging arrangement 101), deviates from the coefficient of thermal expansion CTE-OEB by less than $0.2 \cdot 10^{-6}$ $K^{-1}$, preferably less than $0.15 \cdot 10^{-6}$ $K^{-1}$, more preferably less than $0.1 \cdot 10^{-6}$ $K^{-1}$. As noted above, typically, it is preferred that the deviation ΔCTE(PLCU-OEB) is as close to zero as possible, preferably at least essentially zero.

As a consequence, due to the close match between the coefficient of thermal expansion CTE-PLCU and the coefficient of thermal expansion CTE-OEB, there is, if at all, only very little differential thermal expansion between the parasitic load compensation unit 114 and the optical element body 111. By this approach, parasitic loads PL introduced into the optical element body 111 as a result of a thermal property mismatch between the parasitic load compensation unit 114 and the optical element body 111 may be at least largely avoided.

In the present example, achieving a particularly good match of the coefficient of thermal expansion between the parasitic load compensation unit 114 and the optical element body 111, the coefficient of thermal expansion CTE-PLCU of the parasitic load compensation material is smaller than $2 \cdot 10^{-6}$ $K^{-1}$, preferably smaller than $0.5 \cdot 10^{-6}$ $K^{-1}$, more preferably smaller than $0.1 \cdot 10^{-6}$ $K^{-1}$, more preferably from $-0.1 \cdot 10^{-6}$ $K^{-1}$ to $0.1 \cdot 10^{-6}$ $K^{-1}$.

Furthermore, as outlined above, in the present example, the parasitic load compensation unit 114 is a comparatively rigid component in the parasitic load direction PLD, its rigidity R-PLCU in the parasitic load direction PLD, in certain cases, being considerably higher than the rigidity R-CEU of the connecting element unit 110. Moreover, the rigidity RM-PLCU of the material of the parasitic load compensation unit 114 is at least substantially equal to, preferably noticeably higher than the rigidity RM-OEB of the material of the optical element body 111 in the area of the interface between the optical element body 111 and the connecting element unit 110.

More precisely, in the present example, the rigidity RM-PLCU of the material of the parasitic load compensation unit 114, in the parasitic load compensation direction PLD, is at least M times the rigidity RM-OEB of the material of the optical element body 111 in the area of the component interface 110.6, wherein M ranges from 0.5 to 10, preferably from 1 to 7 more preferably from 2 to 5. By this approach, particularly good compensation of parasitic loads PL is achieved in the parasitic load direction PLD, since, due to the superior rigidity, the parasitic load compensation unit 114 absorbs at least a corresponding majority of the parasitic load PL.

Furthermore, in the present example, in the parasitic load direction PLD, the parasitic load compensation unit rigidity R-PLCU is N times the connecting element unit rigidity R-CEU, wherein with N ranges from 100000 to 0.1, preferably from 50000 to 0.5 more preferably from 20000 to 1. Such a configuration is particularly helpful in achieving, both, good parasitic deformation decoupling (thanks to the decoupling properties of the connecting element unit 110) and low parasitic loads PL introduced into the optical element body 111 (thanks to the action of the parasitic load compensation unit 114).

A major advantage of such a hybrid approach is the fact that magnetostriction related issues can be avoided, since the desired properties, namely, parasitic deformation decoupling for the connecting element unit 110 and matching coefficient of thermal expansion for the parasitic load compensation unit 114 can be achieved using conventional materials not showing noticeable magnetostriction.

Hence, as with the present example, the respective material of the connecting element unit 110 and the parasitic load compensation unit 114 is a non-magnetostrictive material. As noted above, a non-magnetostrictive material in the sense of the present application is a material that is matched to the actual application of the connection arrangement 109 and, under the maximum alteration of the magnetic field MF to be expected at the location of the optical element unit 106.5 during operation of the optical imaging arrangement 101, shows magnetostriction-related alterations in its geometry, which do not go beyond 1 ppm, preferably not beyond 0.1 ppm, more preferably not beyond 0.01 ppm.

As noted above, the connection arrangement 109 may be configured such that, upon alterations in the temperature distribution within the arrangement 109, a certain alteration in the position and/or orientation of the optical element body 111 and the support structure 102.1 may be accepted. Such alterations, in particular, may be accepted in degrees of freedom having a negligible influence on the optical imaging error of the optical imaging arrangement 101.

In the present example, however, such thermally induced alterations are at least largely avoided by a suitable athermal design of the connection arrangement 109 providing sufficient thermal stability in this respect. More precisely, the connecting element unit 110 is an athermal unit, which defines a direction of athermality ATHD (here, along its axial direction AD). Here, the connecting element unit 110 is configured to provide an athermality function by keeping a variation VD in a distance between the support interface 110.5 and the component interface 110.6 along the direction of athermality ATHD below 0.1 μm, preferably below 0.01 μm, more preferably below 0.001 μm, per Kelvin in temperature difference in the connection arrangement 109 (over time).

In the present example, the athermality function is achieved in that the support interface 110.5 defines a support interface plane SIP and the component interface 110.6 defines a component interface plane CIP. The component interface plane CIP is substantially parallel to the support interface plane SIP, and the connecting element unit 110 is configured such that, per Kelvin of temperature difference TD and meter of distance between the support interface 110.5 and the component interface 110.6 along the force flow path FFP, a distance between the support interface plane SIP and the component interface plane CIP varies by less than 10 μm, preferably less than 5 μm, more preferably less than 1 μm.

In the present example, this athermality function is simply achieved in that the component interface plane CIP, at least in one operating state of the optical imaging arrangement 101, in particular in a stationary state during the exposure operation of the optical imaging arrangement 101, substantially coincides with the support interface plane SIP. In such a case, thermal expansion of the connecting element unit 110 does not lead to a shift between the component interface plane CIP and the support interface plane SIP in a direction perpendicular to these planes SIP, CIP, i.e. in the direction of athermality ATHD.

In other words, in the present example, the connecting element unit 110, along the force flow path FFP from the component interface 110.5 to the support interface 110.6, has a first thermal expansion section (formed by the support interface end 110.1 and the immediately adjacent leaf spring element 110.12) thermally expanding in a first direction (along the axial direction AD, i.e. the direction of athermality ATHD) and a subsequent second thermal expansion section (formed by the subsequent leaf spring element 110.12 and the immediately adjacent component interface end 110.2) thermally expanding in a second direction opposite to the first direction. The geometry, in particular, the length along the force flow path FFP, of the first and second thermal expansion section are selected to provide the athermality function.

It will be appreciated that any desired type of connection, including a positive connection, a frictional connection, an adhesive connection and arbitrary combinations thereof, may be implemented between the connecting element unit 110, the optical element body 111 and the parasitic load compensation unit 114. In the present example, either of these connections is an adhesive connection, since such a solution allows particularly simple establishment of the respective connection.

It will be further appreciated that with certain other embodiments, the parasitic load compensation unit 114 may include a plurality of separate elements forming ring segments as it is indicated in FIG. 3 by the dashed contours 115. Such a ring segment 115 connects two (as shown) or more (not shown) mutually separated adjacent segments of the component interface section 110.2. By this approach, suitable parasitic load compensating forces and/or moments may also be introduced into the connecting element unit 110.

With the optical imaging apparatus 101 of FIG. 1 a method of transferring an image of a pattern onto a substrate may be executed using a preferred embodiment of the method of supporting an optical unit according to the disclosure as it will be described in the following with reference to FIGS. 1 to 4.

In a transferring step of this method, an image of the pattern formed on the mask 103.1 is transferred onto the substrate 105.1 using the optical projection unit 104 of the optical imaging arrangement 101, which have been provided in a step S1 in the configuration as outlined above. During this transferring step, the optical element unit 106.5 is supported in the manner as it has been outlined above.

More precisely, in a step S2 during operation of the optical imaging arrangement 101, the optical element unit 106.5 is supported and adjusted to a given setpoint position and orientation as it has been outlined above.

Subsequently, in a step S3, upon an alteration in the temperature distribution within the imaging arrangement 101, a parasitic load compensation and parasitic deformation decoupling is provided at the optical element unit 106.5 using the connection arrangement 109 as it has been outlined above.

Second Embodiment

In the following, a further preferred embodiment of an optical imaging arrangement according to the disclosure including a preferred embodiment of a connection arrangement 209 according to the disclosure will be described with reference to reference to FIGS. 1, 4 and 5. The connection arrangement 209, in its basic design and functionality, largely corresponds to the connection arrangement 109, such that it will be mainly referred to the differences only. The connection arrangement 209 may replace the connection arrangement 109 in the optical imaging apparatus 101. Moreover, while identical components are given identical reference numerals, similar components are given the same reference numerals increased by 100. Unless deviating explanations are given in the following it is here explicitly referred to the explanations given above with respect to the features and functions of these components.

As can be seen from FIG. 5 (showing a view similar to the one of FIG. 2), the only difference of the connection arrangement 209 with respect to the connection arrangement 109 lies in the arrangement of the ring shaped parasitic load compensation unit 214 between the component interface surface 110.6 and the connecting element interface 111.2 of the optical element body 111. Here, the connecting element unit 110 is not connected directly to the optical element body 111. Rather, the connecting element unit 110 is connected to the optical element body 111 via the parasitic load compensation unit 214.

As can be seen from FIG. 5, in the present example, the parasitic load compensation unit 214 is mechanically connected to the component interface end 110.2 at the component interface section 110.4, and the parasitic load compensation unit 214 is an intermediate unit forming an intermediate interface 214.1. The intermediate interface 214.1 is configured to link the optical element body 111 to the connecting element unit 110 via the parasitic load compensation unit 214.

Here again, any desired type of connection, including a positive connection, a frictional connection, an adhesive connection and arbitrary combinations thereof, may be implemented between either of the optical element body 111, the connecting element unit 110 and the parasitic load compensation unit 214. Again, preferably (for the reasons as outlined above), the parasitic load compensation unit 214 is connected to the connecting element unit 110 and/or to the optical element body 111 via an adhesive connection.

Moreover, as is indicated by the dashed contour in FIG. 5, a further (ring shaped) parasitic load compensation unit 216 may be connected to the connecting element unit 110 in a manner similar to the parasitic load compensation unit 114 of FIGS. 2 and 3.

It will be appreciated that, with this embodiment, the methods as outlined in the context of the first embodiment may be executed as well.

Third Embodiment

In the following, a further preferred embodiment of an optical imaging arrangement according to the disclosure including a preferred embodiment of a connection arrangement 309 according to the disclosure will be described with reference to reference to FIGS. 1, 4 and 6. The connection arrangement 309, in its basic design and functionality, largely corresponds to the connection arrangement 109, such that it will be mainly referred to the differences only. The connection arrangement 309 may replace the connection arrangement 109 in the optical imaging apparatus 101. Moreover, while identical components are given identical reference numerals, similar components are given the same reference numerals increased by 200. Unless deviating explanations are given in the following it is here explicitly referred to the explanations given above with respect to the features and functions of these components.

Figure 6:
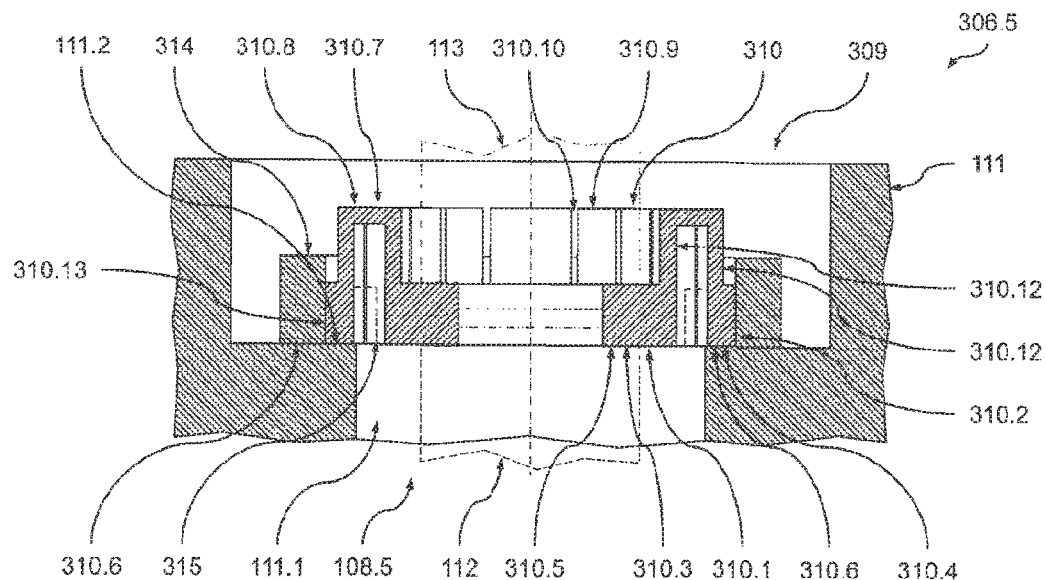
FIG. 6 is a schematic sectional representation of a part of a further preferred embodiment of the connection arrangement according to the disclosure.

As can be seen from FIG. 6 (showing a view similar to the one of FIG. 2), the only difference of the connection arrangement 309 with respect to the connection arrangement 109 lies in the arrangement of the ring shaped parasitic load compensation unit 314 external to an outer circumference of the connecting element unit 310. In the present example, the parasitic load compensation interface surface 310.6 is located at an outer circumference of a protrusion of the connecting element unit 310 forming the component interface end 310.2. It however will be appreciated that, with other embodiments, such a parasitic load compensation interface surface could also be located at an inner circumference of a part of the connecting element unit 310 forming the component interface end 310.2, as it is indicated by the dashed contour 315 in FIG. 6.

Here, the parasitic load compensation interface 310.13 is a cylindrical surface that extends transverse, in particular, substantially perpendicular, to the parasitic load direction PLD (here: the radial direction RD). Here as well, in a comparatively simple manner, the parasitic load compensation unit 314 may be located, both, external to the force flow path FFP and close to the component interface surface 310.6, such that simple and efficient counteraction or compensation of parasitic loads PL is achieved.

It will be further appreciated that, in the present example, the parasitic load compensation unit 214 may also be directly connected to the connecting element interface 111.2 of the optical element body 111.

Here again, any desired type of connection, including a positive connection, a frictional connection, an adhesive connection and arbitrary combinations thereof, may be implemented between either of the optical element body 111, the connecting element unit 310 and the parasitic load compensation unit 314. Again, preferably (for the reasons as outlined above), the parasitic load compensation unit 314 is connected to the connecting element unit 310 and/or to the optical element body 111 via an adhesive connection.

It will be appreciated that, with this embodiment, the methods as outlined in the context of the first embodiment may be executed as well.

Fourth Embodiment

In the following, a further preferred embodiment of an optical imaging arrangement according to the disclosure including a preferred embodiment of a connection arrangement 409 according to the disclosure will be described with reference to reference to FIGS. 1, 4 and 7. The connection arrangement 709, in its basic design and functionality, largely corresponds to the connection arrangement 109, such that it will be mainly referred to the differences only. The connection arrangement 409 may replace the connection arrangement 109 in the optical imaging apparatus 101. Moreover, while identical components are given identical reference numerals, similar components are given the same reference numerals increased by 300. Unless deviating explanations are given in the following it is here explicitly referred to the explanations given above with respect to the features and functions of these components.

Figure 7:
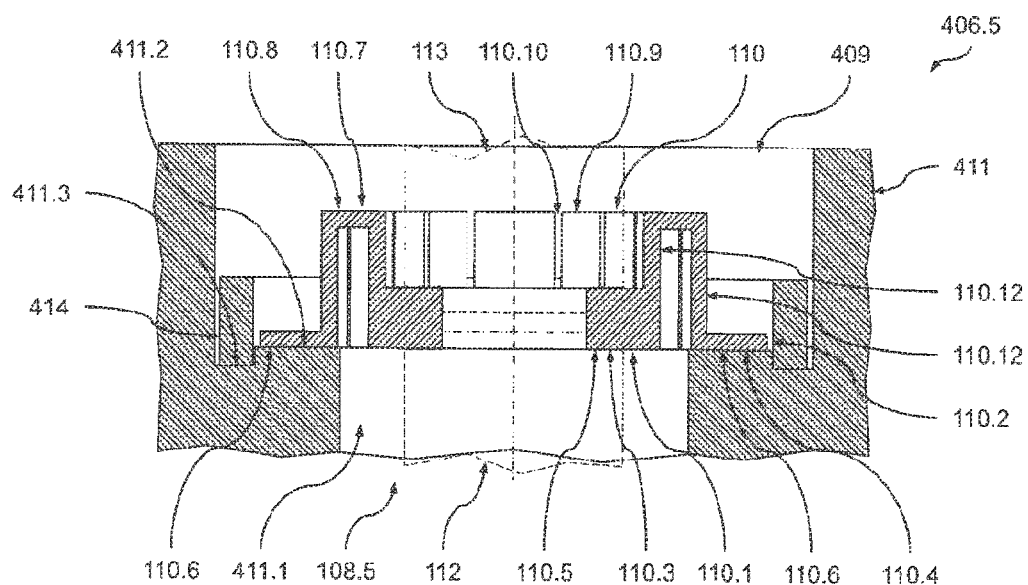
FIG. 7 is a schematic sectional representation of a part of a further preferred embodiment of the connection arrangement according to the disclosure.

As can be seen from FIG. 7 (showing a view similar to the one of FIG. 2), the only difference of the connection arrangement 409 with respect to the connection arrangement 109 lies in the arrangement of the ring shaped parasitic load compensation unit 414 external to an outer circumference of the connecting element unit 110.

Moreover, the ring shaped parasitic load compensation unit 414 is mechanically connected directly to the optical element body 411 itself, while there is no such direct or immediate connection or contact with the connecting element unit 110. More precisely, the parasitic load compensation unit 414 is mechanically connected to a mounting interface 411.3 of the optical element body 411 formed by a corresponding ring shaped recess in the vicinity of the component interface section 110.6. Here as well, in a comparatively simple manner, the parasitic load compensation unit 414 may be located, both, external to the force flow path FFP and close to the component interface surface 310.6, such that simple and efficient counteraction or compensation of parasitic loads PL is achieved.

More precisely, in the present example, the parasitic load compensation unit 414 acts exclusively on the optical element body 411. Hence, the parasitic loads PL stemming from the deformation decoupling action of the connecting element unit 110 (i.e. its elastic deformation) are introduced into the optical element body 411 in the first place but then counteracted by the parasitic load compensation unit 414 acting on the optical element body 411. Here as well, an overall reduction of the parasitic stresses propagating (beyond the component interface region) within the optical element body 411 is achieved.

Here again, any desired type of connection, including a positive connection, a frictional connection, an adhesive connection and arbitrary combinations thereof, may be implemented between either of the optical element body 411, the connecting element unit 110 and the parasitic load compensation unit 414. Again, preferably (for the reasons as outlined above), the optical element body 411 is connected to the connecting element unit 110 and/or to the parasitic load compensation unit 414 via an adhesive connection.

It will be appreciated that, with this embodiment, the methods as outlined in the context of the first embodiment may be executed as well.

Although, in the foregoing, embodiments of the disclosure have been described by way of the example of the optical element unit of the optical projection unit 102 located closest to the substrate unit with its strong and noticeably alternating magnetic fields, it will be appreciated that any desired number of such optical element units (even up to all optical element units) of the optical imaging apparatus 101 (either in the optical projection unit 102 or the illumination unit 105) may be supported in the manner described above. The number of optical element units implementing such a hybrid connection concept typically is a function of the sensitivity of the respective optical element unit to thermal and/or magnetic disturbances in the optical imaging process. Hence, for certain less sensitive optical element units, such a hybrid connection concept may be dispensed with.

Furthermore, it will be appreciated that the present disclosure, although mainly described in the context of microlithography in the foregoing, may also be used in the context of any other type of optical imaging process, typically involving a comparably high level of imaging accuracy. In particular, the disclosure may be used in the context of any other type of optical imaging process operating at different wavelengths.

What is claimed is:

1. An arrangement configured to connect an optical component to a support unit of a support structure, the arrangement comprising:
a connecting element unit having a support interface end with a support interface section and a component interface end with a component interface section,
wherein:
the support interface section is configured to form a support interface to mechanically connect to the support unit;
the component interface section is configured to provide a component interface for mechanical connection to the optical component;
the connecting element unit defines a force flow path between the support interface section and the component interface section so that, when the optical component is supported by the support unit via the connecting element unit, support forces supporting the optical component flow along the force flow path;
at least one parasitic load compensation unit is located in a vicinity of the component interface section and external to the force flow path; and
the parasitic load compensation unit is configured to reduce and/or counteract thermal expansion induced parasitic loads introduced in at least one parasitic load direction into the optical component as a result of thermal expansion of the connecting element unit in the at least one parasitic load direction.

2. The connection arrangement according to claim 1, wherein the at least one parasitic load compensation unit is mechanically connected to the connecting element unit at a parasitic load compensation interface of the component interface end.

3. The connection arrangement according to claim 2, wherein at least one of the following holds:
the component interface section has a component interface surface and the parasitic load compensation interface has a parasitic load compensation interface surface, the component interface surface defining a plane parallel to the at least one parasitic load direction;
the component interface surface and the parasitic load compensation interface surface are located on opposite sides of a protrusion of the connecting element unit forming the component interface end;
the parasitic load compensation interface surface is located at an outer circumference of a protrusion of the connecting element unit forming the component interface end, the parasitic load compensation interface extending substantially perpendicular to the at least one parasitic load direction; and
the at least one parasitic load compensation unit is connected to the connecting element unit via an adhesive connection.

4. The connection arrangement according to claim 1, wherein:
the at least one parasitic load compensation unit is mechanically connected to the component interface end at the component interface;
the at least one parasitic load compensation unit is an intermediate unit that defines an intermediate interface; and
the intermediate interface is configured to link the optical component to the connecting element unit via the at least one parasitic load compensation unit.

5. The connection arrangement according to claim 4, wherein the at least one parasitic load compensation unit is connected to the connecting element unit and/or to the optical component via an adhesive connection.

6. The connection arrangement according to claim 5, wherein the at least one parasitic load compensation unit is mechanically connected to a mounting interface of the optical component located in a vicinity of the component interface section.

7. The connection arrangement according to claim 5, wherein the at least one parasitic load compensation unit is not in contact with the connecting element unit.

8. The connection arrangement according to claim 5, wherein the at least one parasitic load compensation unit is connected to the optical component via an adhesive connection.

9. The connection arrangement according to claim 1, wherein at least one of the following holds:
the parasitic load compensation unit comprises at least one parasitic load compensation material from a parasitic load compensation material group, the parasitic load compensation material group consisting of a ceramic material, a glass ceramic material, a Cordierite material, a titanate-silicate glass, a quartz glass material and combinations thereof;
the parasitic load compensation unit comprises at least one parasitic load compensation material and the optical component comprises at least one component material, the parasitic load compensation material having a coefficient of thermal expansion which, under normal operating conditions of the optical imaging arrangement, deviates from a coefficient of thermal expansion of the component material by less than $0.2 \cdot 10^{-6}$ $K^{-1}$;
the parasitic load compensation unit comprises at least one parasitic load compensation material having a coefficient of thermal expansion smaller than $2 \cdot 10^{-6}$ $K^{-1}$;
the connecting element unit comprises at least one connecting element material selected from the group consisting of a metal material, an Invar material, a stainless steel material, alloys thereof and combinations thereof;
the connecting element unit and/or the parasitic load compensation unit comprises at least one non-magnetostrictive material;
the connecting element unit has a connecting element unit rigidity in the parasitic load direction and the parasitic load compensation unit has a parasitic load compensation unit rigidity in the parasitic load direction that is from 100000 to 0.1 times the connecting element unit rigidity;
the connecting element unit has a connecting element unit rigidity in the at least one parasitic load direction that is from one N/mm to 100000 N/mm; and
the parasitic load compensation unit has a parasitic load compensation unit rigidity of from 1 N/mm to 500000 N/mm in the at least one parasitic load direction.

10. The connection arrangement according to claim 1, wherein:
the optical component has a connecting element interface for connecting the optical component to the connecting element unit;
at least at the connecting element interface is made of a component material;

the parasitic load compensation unit is made of a parasitic load compensation material; and a deviation of a coefficient of thermal expansion of the parasitic load compensation material and the component material is less than 1000%.

11. The connection arrangement according to claim 1, wherein:
the optical component has a connecting element interface for connecting the optical component to the connecting element unit;
at least at the connecting element interface is made of a component material;
the parasitic load compensation unit is made of a parasitic load compensation material; and
a rigidity of a material of the parasitic load compensation unit, in at least one parasitic load compensation direction is from 0.5 to 10 times a rigidity of a material of the optical component in the area of the connecting element interface.

12. The connection arrangement according claim 1, wherein:
the connecting element unit comprises a deformation decoupling section located, along the force flow path, between the support interface section and the component interface section; and
the deformation decoupling section is configured to compensate for differences in thermal expansion of the connecting element unit and the optical component in at least one deformation decoupling direction by elastic deformation of the deformation decoupling section.

13. The connection arrangement according to claim 12, wherein:
the deformation decoupling section comprises at least one spring element, which is elastically deflected to compensate for the differences in thermal expansion;
the at least one spring element comprises a leaf spring element defining a longitudinal leaf spring axis; and
the leaf spring element is configured to be elastically deflected in a bending mode about a bending axis extending perpendicular to a bending plane defined by the longitudinal leaf spring axis and the deformation decoupling direction.

14. The connection arrangement according to claim 12, wherein:
the deformation decoupling section comprises at least one spring section which is configured to be elastically deflected to compensate for the differences in thermal expansion; and
the at least one spring section has a substantially U-shaped cross section in a sectional plane comprising the deformation decoupling direction.

15. The connection arrangement according to claim 1, wherein:
the connecting element unit is an athermal unit, which defines at least one direction of athermality and is configured to provide an athermality function by keeping a variation in a distance between the support interface and the component interface along the at least one direction of athermality below 0.1 µm; and
at least one of the following holds:
the support interface defines a support interface plane and the component interface defines a component interface plane, the component interface plane is substantially parallel to the support interface plane, the connecting element unit being configured such that, per Kelvin of temperature difference and a meter of distance between the support interface and the component interface along the force flow path, a distance between the support interface plane and the component interface plane varies by less than 10 µm;
the support interface defines a support interface plane and the component interface defines a component interface plane, and the component interface plane, at least in a stationary state during the exposure operation of the optical imaging arrangement, substantially coincides with the support interface plane; and
the connecting element unit, along the force flow path from the component interface to the support interface, has a first thermal expansion section thermally expanding in a first direction and a subsequent second thermal expansion section thermally expanding in a second direction opposite to the first direction, and a length along the force flow path of the first and second thermal expansion section being selected to provide the athermality function.

16. The connection arrangement according to claim 1, wherein:
the connecting element unit is a bush element defining an axial direction, a radial direction and a circumferential direction;
the component interface end is formed at a radial protrusion of the bush element protruding radially outward in the radial direction; and
at least one of the following holds:
the bush element is substantially rotationally symmetric about the axial direction;
the component interface is formed at a surface of the radial protrusion facing in the axial direction and/or at a surface of the radial protrusion facing in the radial direction;
the radial protrusion, in the circumferential direction, extends over substantially an entire circumference of the bush element;
the radial protrusion has a segmented design and comprises a plurality of protrusion segments, two adjacent protrusion segments being separated, in the circumferential direction, by a slot within the bush element;
the bush element comprises a deformation decoupling section, which comprises at least one spring section, having a substantially U-shaped cross section in a sectional plane comprising the axial direction, the substantially U-shaped cross section comprising a first leg contacting the support interface section and a second leg contacting the component interface section;
the bush element comprises a deformation decoupling section having a segmented design comprising a plurality of deformation decoupling segments, two adjacent deformation decoupling segments being separated in the circumferential direction by a slot within the bush element; and
the support interface is at a ring shaped or disc shaped base section of the bush element.

17. The connection arrangement according to claim 1, wherein:
the parasitic load compensation unit extends in a circumferential direction of the connecting element unit; and
at least one of the following holds:
the parasitic load compensation unit comprises at least one element forming a ring segment, the ring segment connecting at least two mutually separated adjacent segments of the component interface section; and the parasitic load compensation unit comprises at least one ring element extending along an outer circumference of the connecting element unit, the ring element connecting a plurality of mutually separated segments of the component interface section.

18. An optical imaging arrangement, comprising:
an optical component;
a support structure; and
a connection arrangement according to claim 1 connecting the optical component and the support structure.

19. The optical imaging arrangement of claim 18, wherein at least one of the following holds:
the optical unit comprises an optical element configured to participate in the optical imaging process;
the optical imaging arrangement is configured to be used in microlithography using exposure light at an exposure light wavelength in a UV range;
the exposure light has an exposure light wavelength ranging from 100 nm to 200 nm or from 5 nm to 20 nm;
an illumination unit, a mask unit, an optical projection unit and a substrate unit are provided, wherein the illumination unit is configured to illuminate a mask received by the mask unit with the exposure light, the optical projection unit is configured to transfer an image of a pattern formed on the mask onto a substrate received by the substrate unit, and the optical component is part of the illumination unit or the optical projection unit.

20. A method of connecting an optical component to a support unit of a support structure, the method comprising:
providing a connecting element unit, which has a support interface end with support interface section and a component interface end with a component interface section, wherein the connecting element unit defines a force flow path between the support interface section and the component interface section; and
mechanically connecting a support interface of the support interface section to the support unit and mechanically connecting a component interface of the component interface section to the optical component, such that support forces supporting the optical component flow along the force flow path, wherein:
at least one parasitic load compensation unit is located in a vicinity of the component interface section and external to the force flow path; and
the parasitic load compensation unit reduces and/or counteracts thermal expansion induced parasitic loads introduced in at least one parasitic load direction into the optical component as a result of thermal expansion of the connecting element unit in the at least one parasitic load direction.

* * * * *

UNITED STATES PATENT AND TRADEMARK OFFICE
CERTIFICATE OF CORRECTION

PATENT NO. : 10,520,838 B2
APPLICATION NO. : 16/191627
DATED : December 31, 2019
INVENTOR(S) : Dirk Schaffer and Jens Prochnau It is certified that error appears in the above-identified patent and that said Letters Patent is hereby corrected as shown below:

In the Claims

Column 29, Line 20, Claim 12, after "according" insert -- to --.

Signed and Sealed this
Twenty-eighth Day of April, 2020

Andrei Iancu
*Director of the United States Patent and Trademark Office*